TRANSISTOR INDUCTANCE

Filed Jan. 11, 1965 Sheet 1 of 4

INVENTORS
Manfred Kahn,
Joseph Lindmayer,
William D. North
BY Connolly and Hutz
ATTORNEYS INVENTORS
Manfred Kahn,
Joseph Lindmayer &
William D. North
BY Connolly and Hutz
ATTORNEYS INVENTORS
Manfred Kahn,
Joseph Lindmayer &
William D. North
BY Connolly and Hutz
ATTORNEYS INVENTORS
Manfred Kahn,
Joseph Lindmayer
William D. North
BY Connolly and Hutz
ATTORNEYS United States Patent Office 3,443,236
Patented May 6, 1969

3,443,236

TRANSISTOR INDUCTANCE

Manfred Kahn, Joseph Lindmayer, and William D. North, Williamstown, Mass., assignors to Sprague Electric Company, North Adams, Mass., a corporation of Massachusetts Filed Jan. 11, 1965, Ser. No. 424,516
Int. Cl. H03f 3/42, 3/04
U.S. Cl. 330—12 1 Claim

ABSTRACT OF THE DISCLOSURE

A transistor as an inductive element in an AC circuit having a high Q factor in which the conductivity of the base at the collector is greater than the conductivity of the base at the emitter with a base conductivity gradient over a range of values providing relatively low base resistivities. The combination of the inductive transistor in a circuit with a relatively low resistance between the base and the collector to provide a Q factor much greater than unity.

This invention relates to an inductive transistor and more particularly to employing an inductive transistor providing an improved Q factor as for a tuned amplifier circuit.

The usefulness of a transistor as an inductive element in an AC circuit has been understood. However, prior art circuits containing inductive transistors without Q multiplication effects do not exhibit a Q factor significantly greater than unity. Efforts to increase the Q factor have led to increased noise or have shortened the operating life of the assembly. Moreover, inductive transistor circuits utilizing Q multiplying schemes have exhibited control and temperature stability problems. An inductive transistor, however, is advantageous in its compatibility with microcircuit techniques. With an inductive transistor it is possible to provide an inductive element integrated into the physical structure of a microcircuit along with other electronic elements.

Therefore, it is desired to provide an inductive transistor which can be incorporated into a microcircuit and can provide Q factors comparable to conventional discrete inductive elements in a stable manner. Further it is desirable to provide an amplifier which exhibits these characteristics.

It is an object of this invention to provide a transistor as an inductive element having a high Q factor and stability of operation.

It is another object of this invention to provide an improved transistor showing an inductive impedance between terminals of the transistor.

It is still another object of this invention to provide an amplifier circuit having an inductive element which can be incorporated into an integrated circuit and exhibit a Q factor that is useful in a frequency selective circuit.

It is a further object of this invention to provide an amplifier circuit incorporating an inductive transistor which provides a Q factor much greater than unity.

These and other objects of this invention will become more apparent upon consideration of the following description taken together with the accompanying drawings in which.

The impedance looking into the emitter terminal of the transistor of this invention has a ratio of inductive reactance to effective series resistance in excess of 5. To provide this novel quality factory (Q) this invention provides a conventionally constructed transistor having a grounded-emitter gain (beta) of at least 20, emitter and collector capacitances adequately minimized, and a relatively low impurity gradient through the base. A base impurity gradient provides a base conductivity at the collector that is different than the base conductivity next to the emitter. In order to obtain the high Q factor provided here, it is necessary to restrict the base conductivity gradient to a set of values so that the ratio of base conductivity at the collector $\sigma_{BC}$ to the base conductivity next to the emitter $\sigma_{BE}$ will be $$0.1<\frac{\sigma_{BC}}{\sigma_{BE}}<100$$

The preferred conductivity gradient $$\frac{\sigma_{BC}}{\sigma_{BE}}$$

is about 10. This provides a gradient that is in a direction opposite from what is used in conventional amplifying transistors. An inductive impedance appears in such a transistor due to the transit time effects in the base. Hence, relatively low base resistivities can be used. As a result, high Q values can be obtained with any ratio of majority carrier mobility to minority carrier mobility and with a wide choice of semiconductor materials, including germanium and silicon. More specifically, the parameter values that can be obtained with either of these two materials are of useful values and quite similar.

Figure 1:
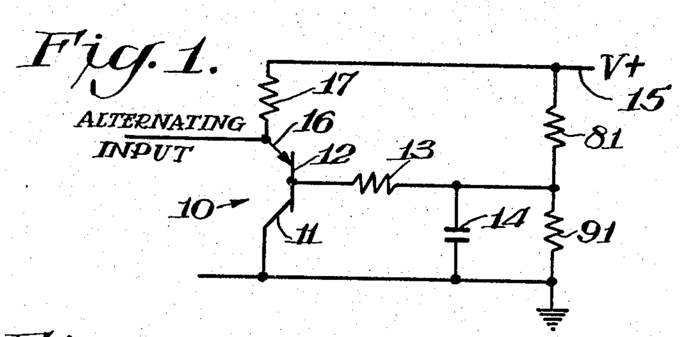
FIGURE 1 is a schematic diagram of the connections for the inductive transistor of this invention.

Through utilization of the impedance of the inductive transistor of this invention with a quality factor considerably in excess of unity, a selective amplifier is provided in which such an inductive transistor is connected as a part of a resonant circuit. The distinctive characteristics of the above-noted transistor are a vital feature. It will be understood that by resonant circuit is meant a lumped capacitor and an inductor simulated by an inductive transistor connected with a grounded collector and a small resistance in the base together with the proper DC biasing as shown in FIGURE 1.

Base resistance as set forth herein refers to the sum of the internal base resistance and an externally connected resistor. Inductance is used in its well recognized sense. The conductivity gradient in the base is limited to values between 0.1 to 100 for $$\frac{\sigma_{BC}}{\sigma_{BE}}$$

More specifically the inductive transistor, in addition to a beta of more than 20 and a base conductivity gradient between 0.1 to 100, has the collector connected to the base through a resistor having a resistance of 10 to 5000 ohms. This resistor has an optimum value according to the particular transistor structure used. The transistor junction capacitances are to be of low value, so as to convey to them reactances that are large compared to the base resistor used. A direct current is applied to the emitter, a direct voltage between the collector and the base resistor, and an AC signal sees the desired impedance between the emitter and the collector terminals of the transistor.

An embodiment for the purpose of description is illustrated with the transistor connected with a grounded collector and a small resistance in the base under a DC bias. When the unit as shown in FIGURE 1 is placed under a bias providing emitter current with the proper biasing resistance, it shows a Q substantially in excess of 1.

Referring to FIGURE 1, transistor 10 is a transistor of this invention described above. The transistor 10 has an AC grounded collector 11, a base 12 AC grounded through a small resistor 13. A capacitor 14 provides the AC grounding. The suitable voltage supply 15 is applied to an emitter 16 through a relatively large biasing resistor 17. The resistors 81 and 91 comprise a voltage divider that supplies the necessary base to collector operating voltage. The AC impedance seen at the emitter 16 has a Q considerably in excess of unity. Quality factors in excess of 5 without Q multiplication can be achieved. The impedance parameters vary by less than 1% per degree C. throughout the normally required ambient.

Figure 2:
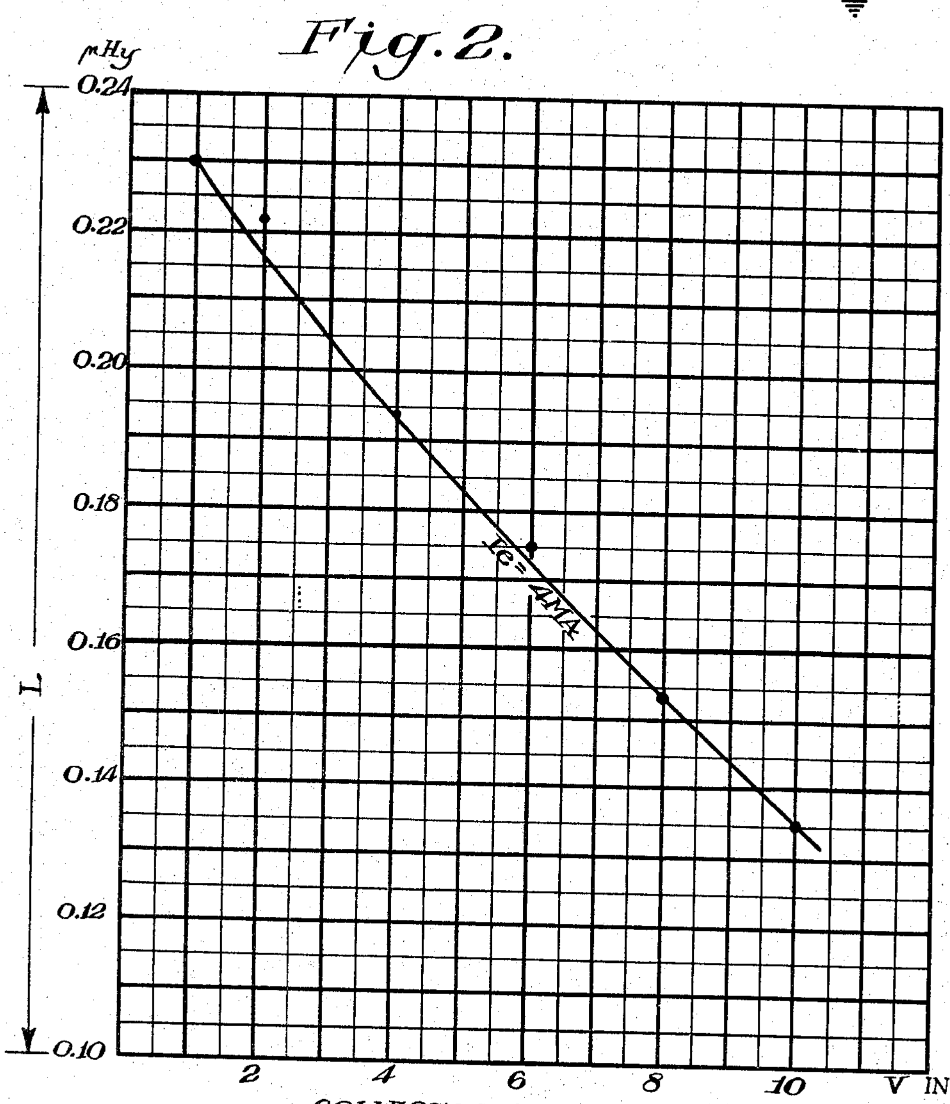
FIGURE 2 shows a plot of inductance against collector voltage for a germanium transistor.

The transistor shows an inverse variation of inductance with collector voltage caused by a decrease in transit time at higher collector voltages. FIGURE 2 illustrates the inductance plotted against collector voltage for a 2N393 type germanium transistor at an emitter current of 4 milliamps, a base resistance of 86 ohms and an input frequency of 30 megacycles.

Figure 5:
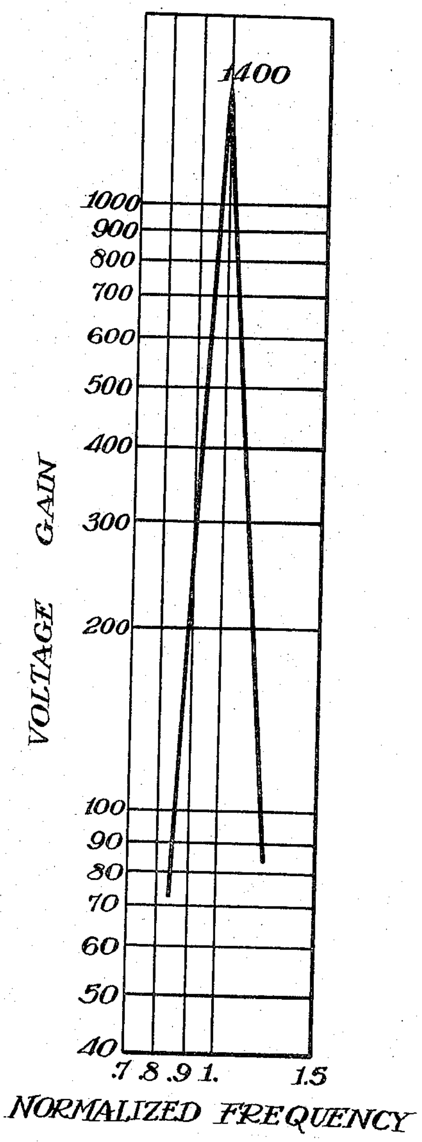
FIGURE 5 is a graph showing a frequency response curve of the three stage amplifier of FIGURE 4.

The invention is also illustrated by the results obtained from the following example:

A planar PNP silicon transistor having a low base gradient, a $BV_{cbo}$ of 51 volts at one microampere and $BV_{ebo}$ of 23 volts at one microampere, a collector capacitance of 3.2 mmfd., and emitter capacitance of 1.1 mmfd. at 6 volts had a beta of 62. It was connected with a base resistor of 500 ohms, and with an input signal of 2.5 mc., the curves of FIGURE 5 show Q to be independent of collector voltage at lower emitter currents. At higher emitter currents a linear relationship is approximated. Both types of dependency provide stable operation as distinguished from prior art avalanche mode of Q multiplication which gives an exponential increase of Q with collector voltage.

Figure 3:
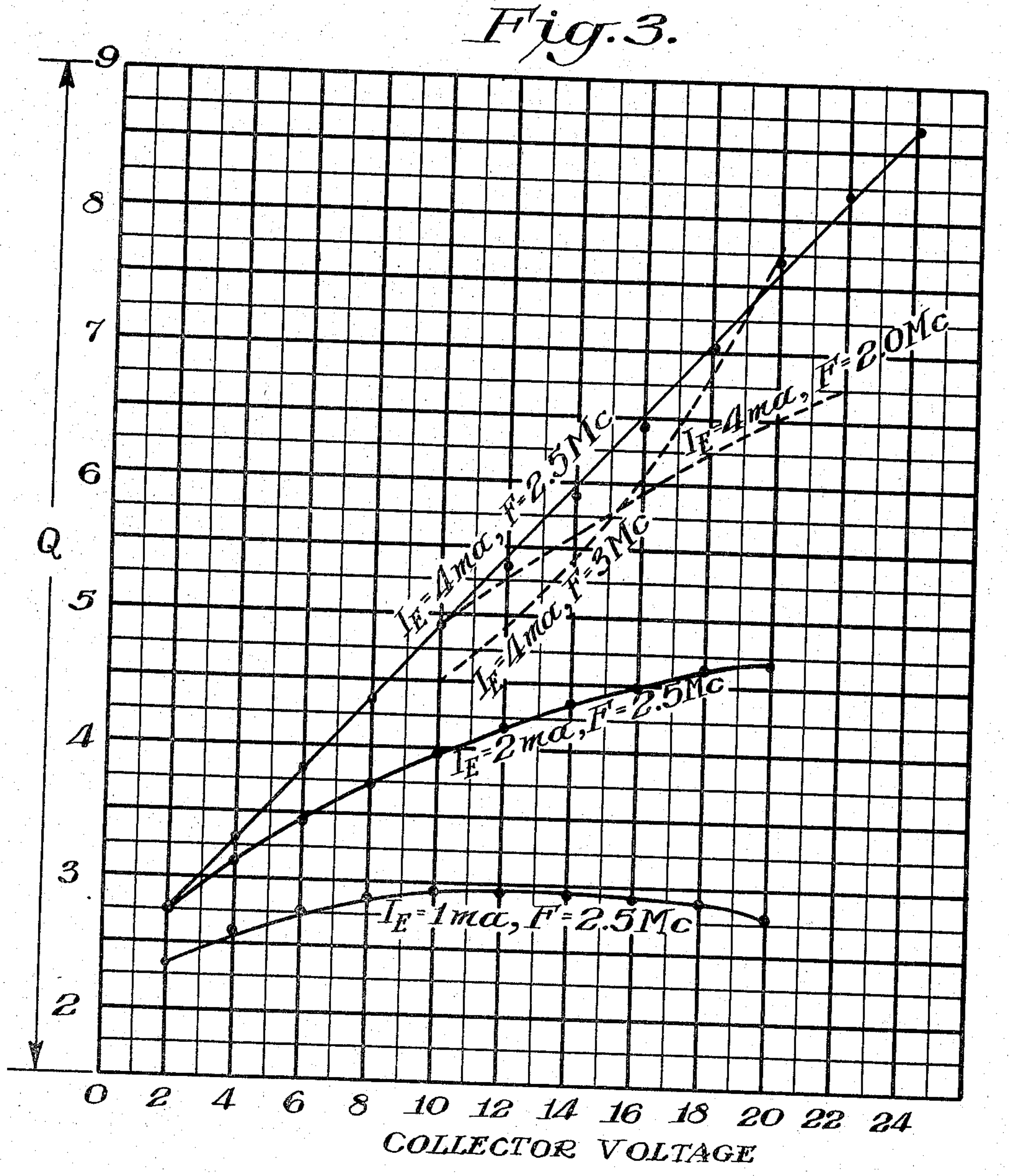
FIGURE 3 shows a plot of the quality factor against voltage for a silicon transistor at several emitter currents.

This invention involves a means for applying a DC bias to an emitter of a grounded collector transistor having a small resistance in the base and a means for applying an alternating signal to the emitter in which the combined bias and signal produces an inductance. Correlatively, the inductance increases with the emitter current and decreases with collector voltage. The quality factor increases with collector voltage as shown in the plot of FIGURE 3. It increases linearly with collector voltage at higher emitter currents.

Figures 4, 6:
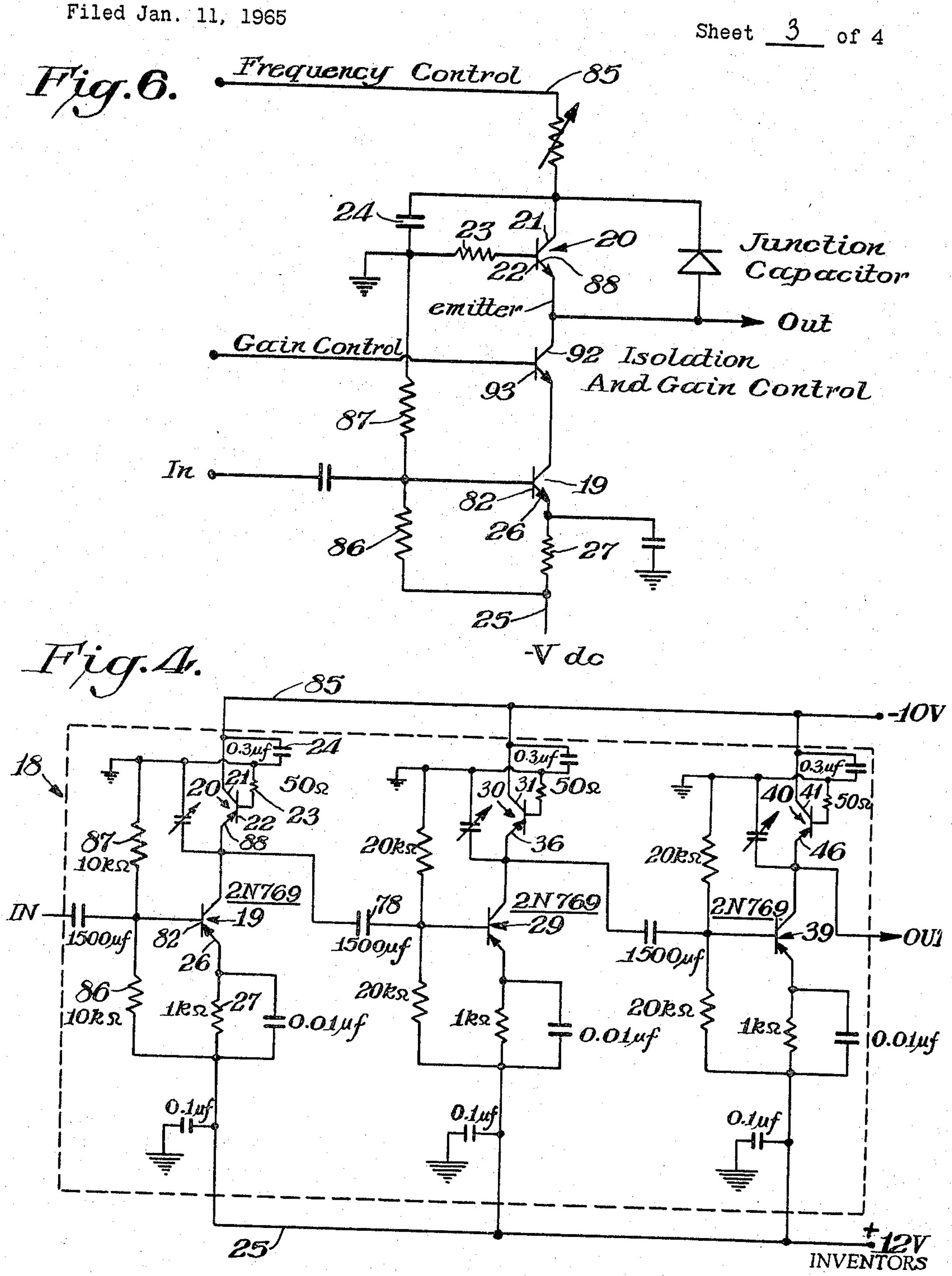
FIGURE 4 is a schematic diagram of an amplifier strip according to this invention.
FIGURE 6 is a schematic diagram of a modified amplifier stage according to this invention.

FIGURE 4 shows an amplifier strip 18 according to this invention consisting of three identical grounded emitter stages connected in series. The inductive transistors

20, 30 and 40 are employed as part of the tuned collector circuits in the respective stages. The amplifier transistor 19 is connected to the emitter of transistor 20. The amplifier transistor 29 is connected to the transistor 30. The amplifier transistor 39 is connected to the inductive transistor 40. The transistor 20 has a collector 21, a capacitor 24 providing an AC ground for the collector and a base 22 connected to a small resistor 23 of 50 ohms. DC current is provided from a voltage supply 25 to the emitter 26 through biasing resistor 27 and the DC voltage is supplied to the base 82 of transistor 19 through the voltage divider 86 and 87. The amplifier transistor 19 can be of the nature of a 2N769. The small grounded base resistor 23 clamps the emitter 88 of the transistor 20 to within one volt above ground. A negative power supply 85 provides a means of independently varying the collector voltage of the inductive transistor.

The second grounded emitter stage is connected to the output of the first stage through a coupling capacitor 78. The amplifier transistor 29 is connected to the coupling capacitor 78 and in turn to the inductive transistor 30.

The values of the components in the amplifier 18 are indicated in FIGURE 4. It will be understood that this is merely one embodiment of this invention for the purpose of illustration. This embodiment illustrates the importance in the inductive transistor 20 of the vital features referred to above, i.e., a base with a resistivity gradient between 0.1 to 100, a beta of 20 or more and minimized emitter and collector capacitances.

The inductive transistor of this invention as illustrated in the figures contains the inductance characteristics necessary to provide a satisfactory inductive element. This is in part evidenced by the frequency response curve shown in FIGURE 5 of the amplifier 18. Voltage gain is plotted against frequency. The center frequency gain reaches a value of more than 62 db. The narrow frequency response is a distinguishing characteristic of this invention.

Among other advantages this invention provides a stable inductive element subject to all necessary controls which can be integrated into a silicon base circuit with other electronic elements.

It will be apparent that various further applications of this invention may be achieved. For example, the inductive transistor of this invention may be employed in intermediate frequency amplifiers. Such employment in intermediate frequency amplifiers requires gain control. Gain control can be achieved either by diode attenuation networks or varying the gain of the amplifier transistor.

FIGURE 6 shows an amplifier stage illustrating the combination of interstage isolation and gain control in an additional transistor. FIGURE 6 shows the amplifier transistor 19 and the inductive transistor 20 analogous to corresponding parts in FIGURE 4. The amplifier transistor 19 has an emitter 26 connected to a DC voltage supply 25 through a biasing resistor 27 and a base 82 connected to the voltage supply 25 through the voltage divider 86 and 87. The inductive transistor 20 has an emitter 88, and a base 22 connected to its collector 21 through the small resistor 23 and the capacitor 24. These elements in the stage of FIGURE 6 perform functions analogous to the corresponding elements in FIGURE 4. Isolation and gain control is provided by an AC grounded base transistor 92 which has its emitter connected to the collector of the amplifier transistor 19 and its collector connected to the emitter of the inductive transistor 20. A DC gain control voltage is applied to the base 93 of the transistor 92.

It should be understood that the above-described embodiments are only for the purpose of illustration. The principle of this invention may be employed in further modifications and variations, for example, a tuning capacitor may be connected between the emitter and collector of the transistor. Further, this capacitor may be comprised of a variable capacitance diode.

What is claimed is:

1. A high Q producing inductive circuit comprising a PNP transistor having a low base gradient, a collector connected to AC ground, an AC connection of said transistor base to said transistor collector through a base resistor of a resistance from 10 to 5000 ohms and a capacitor connected in series with said resistor, a source of current, a voltage divider network connected to said current source, said base resistor and the transistor collector for providing a direct voltage between the collector and the base resistor of less than 20 volts and an emitter biasing resistor connected between the transistor emitter and the current source having a relatively high resistance value in relation to the base resistance consisting of the base region and the series connected base resistor, said emitter biasing resistor direct current conductively connecting said current source to said emitter, the emitter and collector having capacitances providing reactances that are large compared to the base resistor, and an input means connected to the emitter.

References Cited

UNITED STATES PATENTS

| | | | |
|---|---|---|---|
| 3,042,844 | 7/1962 | Watanabe et al. | 317—234 |
| 3,119,075 | 1/1964 | Dill | 330—38 XR |
| 3,178,662 | 4/1965 | Dill et al. | 333—80 |
| 3,160,835 | 12/1964 | Christensen | 333—80 |

NATHAN KAUFMAN, *Primary Examiner.*

U.S. Cl. X.R.

330—18, 24, 40